US011429756B2

(12) United States Patent
Birkett-Smith et al.

(10) Patent No.: US 11,429,756 B2
(45) Date of Patent: Aug. 30, 2022

(54) CAD MODELS BY CREATING BEST-FIT APPROXIMATE 3D B-REP GEOMETRY

(71) Applicant: Dassault Systemes SolidWorks Corporation, Waltham, MA (US)

(72) Inventors: Nick Birkett-Smith, Cambridge (GB); Manish Bharvirkar, Pune (IN)

(73) Assignee: DASSAULT SYSTEMES SOLIDWORKS CORPORATION, Waltham, MA (US)

( * ) Notice: Subject to any disclaimer, the term of this patent is extended or adjusted under 35 U.S.C. 154(b) by 575 days.

(21) Appl. No.: 16/269,390

(22) Filed: Feb. 6, 2019

(65) Prior Publication Data

US 2020/0201945 A1    Jun. 25, 2020

(30) Foreign Application Priority Data

Dec. 24, 2018  (IN) .............................. 201821048837

(51) Int. Cl.
*G06F 30/00* (2020.01)
*G06T 17/10* (2006.01)
*G06T 19/20* (2011.01)

(52) U.S. Cl.
CPC .............. *G06F 30/00* (2020.01); *G06T 17/10* (2013.01); *G06T 19/20* (2013.01)

(58) Field of Classification Search
CPC .......... G06F 30/00; G06F 30/17; G06F 30/10; G06T 17/10; G06T 19/20; G06T 2200/24; G06T 2210/12; G06T 2219/2021
See application file for complete search history.

(56) References Cited

U.S. PATENT DOCUMENTS

2004/0249809 A1* 12/2004 Ramani ................ G06K 9/6892
2013/0046511 A1*  2/2013 Tayal ...................... G06T 19/20
                                                                   703/1

(Continued)

OTHER PUBLICATIONS

Seimens, User interface basics, spse01501, 2015 Siemens Product Lifecycle Management Software Inc, 142 pages.

(Continued)

*Primary Examiner* — Bijan Mapar
(74) *Attorney, Agent, or Firm* — Hamilton, Brook, Smith & Reynolds, P.C.

(57) ABSTRACT

Improved CAD systems provide automatic generation of simplified and defeatured versions of complex 3D CAD models. The systems receive a 3D model representing a real-world object as an assembly. The model is formed of the assembly, plural components, and features. In response to user command, the systems select one or more components of the plural components. The systems apply a simplification operation to the selected one or more components. The simplification operation derives a simplified geometric entity (e.g., box, cylinder, solid 3D polygonal outline, or solid 3D tight fit outline) by projecting at least one silhouette outline that encloses the selected one or more components. The at least one projected silhouette outline excludes features of the selected one or more components from graphical view. The systems generate a simplified model from the derived simplified geometric entity. The systems may use the generated simplified model to replace components in 3D models.

27 Claims, 10 Drawing Sheets

(56) References Cited

U.S. PATENT DOCUMENTS

2014/0028675 A1\* 1/2014 Zegdoun ................ G06F 30/00
                                                    345/420
2018/0122138 A1\* 5/2018 Piya ........................ G06T 17/10
2018/0181682 A1\* 6/2018 Rorato .................... G06F 30/00

OTHER PUBLICATIONS

Autodesk Inventor 2014, Large Assembly Performance, 41 pages.
Smedley et al, "Inventor Simplification, Lean Assembly Processes", Autodesk University 2013, 19 pages.

\* cited by examiner

CAD MODELS BY CREATING BEST-FIT APPROXIMATE 3D B-REP GEOMETRY

RELATED APPLICATION(S)

This application claims priority under 35 U.S.C. § 119 or 365 to India Application No. 201821048837, filed Dec. 24, 2018. The entire teachings of the above application(s) are incorporated herein by reference.

BACKGROUND

Computer-aided design (CAD) software allows a user to construct and manipulate complex three-dimensional (3D) models. A number of different modeling techniques can be used to create a 3D CAD model of a part, including a solid modeling technique. This technique may use a boundary representation (B-rep) geometry that represents the 3D model as a collection of interconnected topological entities (e.g., vertices, edges, and faces) forming a topological structure of the part. The topological entities have corresponding supporting geometrical entities (e.g., points, trimmed curves, and trimmed surfaces). The trimmed surfaces of the topological entities correspond to the topological faces bounded by the edges. By using such a representation, the CAD software can evaluate many properties of the part from its 3D model.

In general, a solid model consists of various features created by modeling operations. For example, a solid model may include a boss created by an extrude operation and a hole created by a cut operation. In addition to bosses and holes, features include fillets, shells, sweeps, and chamfers by way of non-limiting example.

A design engineer is a typical user of a CAD system. The design engineer designs physical and aesthetic aspects of 3D models, and is skilled in 3D modeling techniques. The design engineer creates 3D parts and may assemble the 3D parts into a subassembly or an assembly represented by a 3D model. A subassembly may also consist of other subassemblies. An assembly is designed using parts and subassemblies. Parts, subassemblies, solid bodies, and surface bodies are hereinafter collectively referred to as components. Components may be quite complex (e.g., include 100 or more features), and a 3D model may be quite complex (e.g., include thousands of subassemblies).

When working with 3D models (B-rep geometry) in a CAD system, the performance and responsiveness of the software is impacted by the amount of detail/data in the 3D model. 3D models with thousands of components may contain millions of faces, which can cause significant performance problems, impacting load and save times, graphics performance, and calculation times for commands. To improve performance, it is common practice to simplify a complex 3D model to remove features and use the simplified version in downstream operations, such as building a top-level assembly (e.g., a factory layout) or preparing layout drawings.

However, prior art simplification approaches do not provide an effective solution for simplifying such models. Some prior art simplification approaches require the time-consuming manual removal of features from an original model to create the simplified model, or manual transfer of geometry from the original model to a simplified model. Further, these approaches provide no associativity between the simplified model and the original model, which causes design changes in the original model to not be automatically reflected in the simplified model. Other prior art simplification approaches partially compose the simplified model with graphical tessellation data which limits the use of the simplified model in downstream operations, such as creating drawing views. Yet other prior art simplification approaches require excessive compute time and memory requirements by analyzing all geometry of the original model to remove features to create the simplified model.

SUMMARY

Embodiments of the present invention generate a simplified version of a complex 3D model in a manner that overcome deficiencies in the prior art. The simplified model is automatically generated in response to a user selecting components of the original complex model and selecting a simplification operation through the CAD system. The simplified model is composed of B-rep data, which enables the simplified model to be used in downstream drawing operations. The simplified model is also associative to the original model, which enables design changes in the original model to be automatically reflected in the simplified model.

Embodiments of the invention are directed to computer-implemented methods, computer systems, and computer program products for simplifying a computer-aided design (CAD) model. The computer systems comprise a processor operatively coupled to a data storage system, the data storage system storing a CAD model. The computer systems also comprise a data storage memory operatively coupled to the processor and comprising instructions to configure the processor to perform methods of the embodiments. The computer program products comprise a non-transitory computer-readable storage medium having code instructions stored thereon. The methods, systems, and computer program products receive a CAD model of a real-world object. The received CAD model represents the real-world object as an assembly of plural components, and the plural components have features. Different features form different components. In some embodiments, the selected one or more components include at least one of: a part, a subassembly, a solid body, and a surface body of the real-world object as represented in the CAD model. In response to user command, the methods, systems, and computer program products select one or more components of the plural components of the received CAD model. The selected one or more components are in a neighborhood such that the selected one or more components are adjacent to each other or otherwise in spatial proximity.

The methods, systems, and computer program products apply a simplification operation to the selected one or more components. The simplification operation derives a simplified geometric entity by projecting at least one silhouette outline that encloses the selected one or more components. In some embodiments, if the selected one or more components are unable to be enclosed by a single projected silhouette outline, the methods, systems, and computer program products project multiple silhouette outlines to enclose the selected one or more components. In some embodiments, the simplification operation derives a separate simplified geometric entity for each of the selected one or more components. In some embodiments, the simplification operation automatically determines a projection direction for the at least one projected silhouette outline by using the largest planar face of the selected one or more components. The methods, systems, and computer program products combine the multiple projected silhouette outlines by using a Boolean operation to locate common volume of the selected one or more components. In some embodiments, the derived simplified geometric entity is a three-dimensional (3D) boundary representation (B-rep) geometry. The at least one projected silhouette outline excludes features of the selected one or more components in the simplified geometric entity. In some embodiments, the at least one projected silhouette outline excludes the features from view of the user and from memory (e.g., a part file) storing the simplified model.

The methods, systems, and computer program products generate a simplified CAD model from the derived simplified geometric entity, and replaces components in at least one CAD model (including the received CAD model or other CAD models) with the generated simplified CAD model. The methods, systems, and computer program products may use a separate command (from the command used to simplify/defeature the received CAD model) to replace the components in the at least one CAD model. In some embodiments, the simplified geometric entity of the generated simplified CAD model is associated in memory to the selected one or more components of the received CAD model, the association enabling updating the generated simplified CAD model when a user changes the received CAD model.

In some embodiments, applying the simplification operation may include selecting a type for each projected silhouette outline, where the selected type is one or more of: a rectangle, a circle, a polygon outline, and a tight fit outline. In some embodiments, applying the simplification operation may include selecting an orientation of the derived simplified geometric entity, where the selected orientation is one or more of: automatic, front plane, side plane, top plane, and custom plane. In some embodiments, applying the simplification operation may include indicating certain features of the selected one or more components that are to be maintained in the derived simplified geometric entity. In some embodiments, applying the simplification operation may include indicating small components that are less than a certain percentage of the CAD model assembly and are to be ignored when projecting the at least one silhouette outline. In some embodiments, applying the simplification operation may include indicating whether to derive one simplified geometric entity or multiple simplified geometric entities from the selected one or more components.

In example embodiments, if the selected type is a rectangle, the methods, systems, and computer program products generate the at least one projected silhouette outline by automatically computing a smallest volume bounding box capable of tightly enclosing (fitting around) the selected one or more components. In example embodiments, if the selected type is a circle, the methods, systems, and computer program products generate the at least one projected silhouette outline by automatically computing a smallest volume bounding cylinder capable of tightly enclosing (fitting around) the selected one or more components. The methods, systems, and computer program products compute the radius, the axis, and the center point of the bounding cylinder using the largest cylindrical face of the selected one or more components.

In example embodiments, if the selection type is a polygon outline, the methods, systems, and computer program products generate the at least one projected silhouette outline by automatically computing a 3D polygon body that tightly encloses the selected one or more components as follows. The methods, systems, and computer program products create an initial outline of the selected one or more components from an automatically determined projection direction. The methods, systems, and computer program products next project the initial outline on a plane and compute a convex hull polygon around the initial outline to create a planar polygon. The methods, systems, and computer program products then extrude the created planar polygon in the automatically determined projection direction to form the projected silhouette outline (solid tight fit 3D polygonal body) to fit around the selected one or more components.

In example embodiments, if the selection type is a tight fit outline, the methods, systems, and computer program products generate the at least one projected silhouette outline by automatically computing a 3D body that tightly encloses the selected one or more components as follows. The methods, systems, and computer program products create an initial outline of the selected one or more components from an automatically determined projection direction. The methods, systems, and computer program products then extrude the initial outline in the automatically determined projection direction to form the projected silhouette outline (solid tight fit 3D outline) to fit around the selected one or more components.

In some embodiments, the methods, systems, and computer program products configure multiple groups of components, where each group is formed by selecting one or more components of the received CAD model. The methods, systems, and computer program products apply the simplification operation to each of the multiple groups and derive respective simplified geometric entities. The methods, systems, and computer program products next create one simplified geometric entity by merging the respective derived simplified geometric entities. The methods, systems, and computer program products generate the simplified CAD model from the one simplified geometric entity.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

Figure 1A:
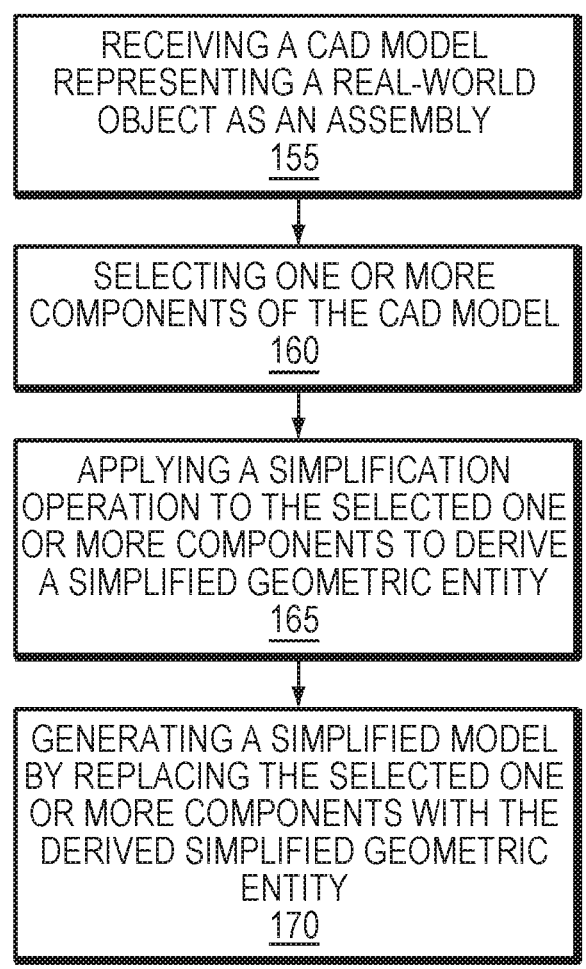
FIG. 1A is a flow diagram of an example defeaturing method with simplification operation used in embodiments of the present invention.

A description of example embodiments follows.

The teachings of all patents, published applications and references cited herein are incorporated by reference in their entirety.

When working with 3D models (B-rep geometry) in a CAD system, the performance and responsiveness of the software is impacted by the amount of detail/data in the models. 3D models with thousands of components may contain millions of faces, which can cause significant performance problems, impacting load and save times, graphics performance, and calculation times for commands. To improve performance, it is common practice to simplify a complex 3D model to remove features and use the simplified version in downstream operations, such as building a top-level assembly (e.g., a factory layout) or preparing layout drawings.

Prior art simplification approaches enable users to simplify a complex model in the following ways, which each have disadvantages and restrictions. In a first prior art approach, a user may create a new simplified model of a component in an original model. Such creation involves the user generating new features (e.g., sketches, extrude features, revolve features, etc.) that are an approximate match to the component in the original model. Such creation is a manual process and is very time consuming since measurements must be manually transferred to the simplified model from the original model. Further, there is no associativity between the simplified model and the original model, thus, design changes in the assembly of the original model are not automatically reflected in the simplified model.

In a second prior art approach, the user may update the original model by removing small, insignificant, internal, or unwanted component geometry from the original model. The updated original model is then saved as the simplified model. The removal is a manual process and the amount of reduction made to the original model is likely inadequate to improve model performance since such removal does not change the geometry of any complex components of the original model. Again, there is no associativity between the simplified model and the original model, thus, design changes in the assembly of the original model are not automatically reflected in the simplified model.

In a third prior art approach, the user may create a "hybrid" model composed of a mix of B-rep data and graphical tessellation data. In creating the hybrid model, the user selects B-rep data needed to maintain design intent of the original model, and the remainder of the hybrid model is composed with graphical tessellation data, which has a significantly lower impact on model performance. In existing CAD products, this technology is known as a SpeedPak model. Using the hybrid (SpeedPak) model, there are technical limitations on many downstream operations. For example, the graphical tessellation data in a SpeedPak model cannot be used for creating high quality/precise drawing views since B-rep geometry is needed for such views. The graphical tessellation data also cannot be used for exporting the SpeedPak model in drawing interchange format (DXF) or vector-based portable document format (PDF), as the graphical tessellation data has no dimensions or annotations attached to any of the Speedpak graphics.

In a fourth prior art approach, the user uses an existing defeature tool to analyze all the geometry in an original model, and simplify the analyzed geometry by removing small details (features) such as holes, fillets, and embossed text. The existing defeature tool then fills-in any enclosed voids in the simplified geometry to consume any internal detail. The existing defeature tool outputs a simplified model that is saved as a separate part file from the original model. In existing CAD software, this process is known as defeaturing. The existing defeaturing process is computationally intensive and not practical to use on an assembly of a complex model having thousands of components due to the excessive compute time and memory requirements of the process. In addition, the existing defeature tool is less effective at simplifying models representing open frameworks as used for industrial equipment, such as packaging machinery. The existing defeature tool is more effective when a represented framework has a "watertight" enclosure, such as a gearbox casing.

Embodiments of the present invention are directed to automatically generating simplified (defeatured) versions of complex 3D models in a manner that overcomes deficiencies in prior art methods. The embodiments may operate in a CAD system on solid models represented by B-rep geometry. The embodiments automatically derive simplified geometric entities, such as cuboids, cylinders, extruded profiles/outlines, etc., that approximate the shape of user-selected components in an original 3D model. The derived simplified entities may also be represented by 3D B-rep geometry. The simplified geometric entities are derived by projecting a silhouette outline (e.g., rectangle, circle, polygon outline, tight fit outline, etc.) enclosing the selected components, and extending the projected silhouette outline to tightly fit the volume of the selected components in 3D space. Features of the selected components or bodies are excluded from the simplified geometric entities. Embodiments generate a simplified CAD model from the simplified geometric entity. Embodiments replacing components in a CAD model with the generated simplified CAD model.

The geometry of the simplified model of the embodiments is automatically calculated to be a close match to the geometry of the original model. Thus, this simplified model is more efficient and faster to create and use than the first prior art approach and the fourth prior art approach described above. Typically, the simplified model of the embodiments is significantly simpler (includes less details/data) than the second prior art approach and fourth prior art approach described above, resulting in performance improvements over these approaches. The simplified model is represented by a B-rep geometry and data, which means that the simplified model is not subject to any of the restrictions and technical limitations in downstream drawing operations as the third prior art approach described above. The simplified model of embodiments may also be associative to the original model, which enables design changes in the original model to be reflected in the simplified model. By the simplified model being associative to the original model, any subsequent updates to the original model can be applied automatically to the simplified model. In some embodiments, the associativity enables any subsequent updates to the simplified model also be applied automatically to the original model.

Example Methods of Simplifying (Defeaturing) CAD Model

FIG. 1A is an example method 100 of simplifying and defeaturing a 3D CAD model in embodiments of the present invention. The method 100 begins at step 155 by receiving a 3D model of a real-world object at a CAD system. The received 3D model represents the real-world object as an assembly of plural components and the plural components having features. The term plural components used herein includes parts, subassemblies, solid bodies, and surface bodies of the CAD model. The CAD system may load the received 3D model from a part file or other formatted memory communicatively coupled to the CAD system. The CAD system may present the received 3D model to the user through a graphical view of a user interface of the CAD system, such as graphical view 310 of FIG. 3.

The method 100, at step 160, selects one or more components of the 3D model in response to user interaction or command. For example, a user may implicate or otherwise select the one or more components through the user interface of the CAD system by a user command, such as through dropdown menus 215 and 220 of FIG. 2. For another example, the user may select the one or more components through the graphical view of the CAD system, such as by indicating the one or more components through graphical view 310 of FIG. 3. The selected one or more components may be situated in a neighborhood, such that the selected one or more components are adjacent to each other or otherwise in spatial proximity. The user may identify the selected one or more components as a named group, such as through textbox 212 of FIG. 2. In response to the user interaction or command, the CAD system selects the subject one or more components (e.g., named group) for simplification in the 3D model.

The method 100, at step 165, then applies a simplification operation to the selected one or more components to derive a simplified (and defeatured) geometric entity that approximates the geometry of the selected one or more components. In some embodiments, the simplification operation derives a separate simplified (and defeatured) geometric entity for each of the selected one or more components. The derived simplified geometric entity may be represented by a three-dimensional (3D) boundary representation (B-rep) geometry. The CAD system executes the simplification operation to derive the simplified geometric entity according to a user-selected simplification type (silhouette type). The user may select the simplification type for the selected one or more components through the user interface of the CAD system, such as through dropdown menu 225 of FIG. 2. The simplification type may be a rectangle, a circle, a polygon outline, a tight fit outline, and the like. To derive the at least one simplified geometric entity, the simplification operation projects a silhouette outline of the selected simplification type that encloses the selected one or more components. The simplification operation automatically determines the direction of the projected silhouette outline based on the largest planar face of the selected one or more components. Features of the selected one or more components are excluded from graphical view by the projected silhouette outline (derived simplified geometric entity). In some embodiments, the user may configure the simplification operation to not exclude certain features (e.g., holes, cuts, and the like) of the selected one or more components, such as by selecting the "Keep internal loops" checkbox 235 of FIG. 2.

If the simplification type is rectangle, the simplification operation (step 165) projects the silhouette outline of a rectangle to enclose the selected one or more components. The simplification operation extends the projected rectangle silhouette outline in the 3D space by automatically computing a smallest ("best fit") volume bounding box that can tightly enclose (fit around or wrap) the selected one or more components. The bounding box excludes features of the selected one or more components from graphical view. The bounding box need not be aligned (oriented) with the coordinate system of the received 3D model of step 155. The user may select a direction to orient the bounding box in the 3D model. The user may make this selection through the user interface of the CAD system, such as through menu 240 of FIG. 2. The simplification operation outputs the bounding box as the simplified geometric entity of the selected one or more components, as shown by the example in FIG. 4A (410).

If the simplification type is circle, the simplification operation (step 165) projects a silhouette outline of a circle to enclose the selected one or more components. The simplification operation extends the projected circle silhouette outline in the 3D space by automatically computing a smallest ("best-fit") volume bounding cylinder that can tightly enclose (fit around or wrap) the selected one or more components. If the selected one or more components are of a cylindrical geometry, the simplification operation may compute the radius, axis, and center point of the bounding cylinder based on the largest cylindrical faces of the one or more selected components. If their geometry is not completely cylindrical (e.g., conical, helical, cut or partially round, etc.), the simplification operation iterates through the geometry of the selected one or more components to compute the cylinder radius, axis, and center point for the bounding cylinder that best-fits the selected one or more components. The simplification type of circle may be used for any group of selected one or more components, even if the group is of a non-cylindrical geometry. The bounding cylinder excludes features of the selected one or more components from graphical view. The user may also select a direction to orient the bounding cylinder in the 3D model. The simplification operation (step 165) outputs the bounding cylinder as the simplified geometric entity of the selected one or more components, as shown by the example in FIG. 4B (430).

If the simplification type is polygon outline, the simplification captures a silhouette outline of the selected one or more components from the automatically determined direction. The simplification operation (step 165) projects the captured silhouette outline on a plane and computes a convex hull polygon that encloses the projected silhouette outline on the plane. The simplification operation extrudes the computed convex hull polygon in the automatically determined direction to form a solid tight fit 3D polygonal body around the selected one or more components. The solid tight fit 3D polygonal body excludes features of the selected one or more components from graphical view. In some embodiments, the user may configure the simplification operation to not exclude certain features (e.g., holes, cuts, and the like) of the selected one or more components from the solid tight fit 3D polygonal body, such as by selecting the "Keep internal loops" checkbox 235 of FIG. 2. The user may select a direction to orient the solid tight fit polygonal body in the CAD model. The simplification operation (step 165) outputs the solid tight fit 3D polygonal body as the simplified geometric entity for the selected one or more components, as shown by the example in FIG. 4C (470).

If the simplification type is tight fit outline, the simplification operation (step 165) captures a silhouette outline of the selected one or more components from the automatically determined direction. The simplification operation projects the silhouette outline on a plane and extrudes the projected silhouette outline in the automatically determined direction to form a solid tight fit 3D body around the selected one or more components. Thus, the tight fit outline functions similar to the polygon outline, except for the tight fit outline, the simplification operation uses the exact captured outline of the selected one or more components for extruding the tight fit body, rather than computing a convex hull (as for the polygon type). The solid tight fit 3D body excludes features of the selected one or more components from graphical view. In some embodiments, the user may configure the simplification operation to not exclude certain features (e.g., holes, cuts, and the like) of the selected one or more components from the solid tight fit 3D body, such as by selecting the "Keep internal loops" checkbox 235 of FIG. 2. The user may select a single direction or multiple directions to orient the solid tight fit body. The simplification operation outputs the solid tight fit 3D body as the simplified geometric entity for the selected one or more components.

If the shape of the selected one or more components cannot be adequately approximated by a single projected silhouette outline, the simplification operation may project multiple silhouette outlines (of appropriate simplification types described above) to enclose the selected one or more components. To derive the simplified geometric entity, the multiple projected silhouette outlines are then combined according to the common volume of their enclosed components using a Boolean operation. Boolean operations are known or common in the art techniques for joining (union), subtracting, and intersecting volumes of solid models to create new solid models. Other known or common in the art techniques for combining volumes are also suitable.

Figure 4A:
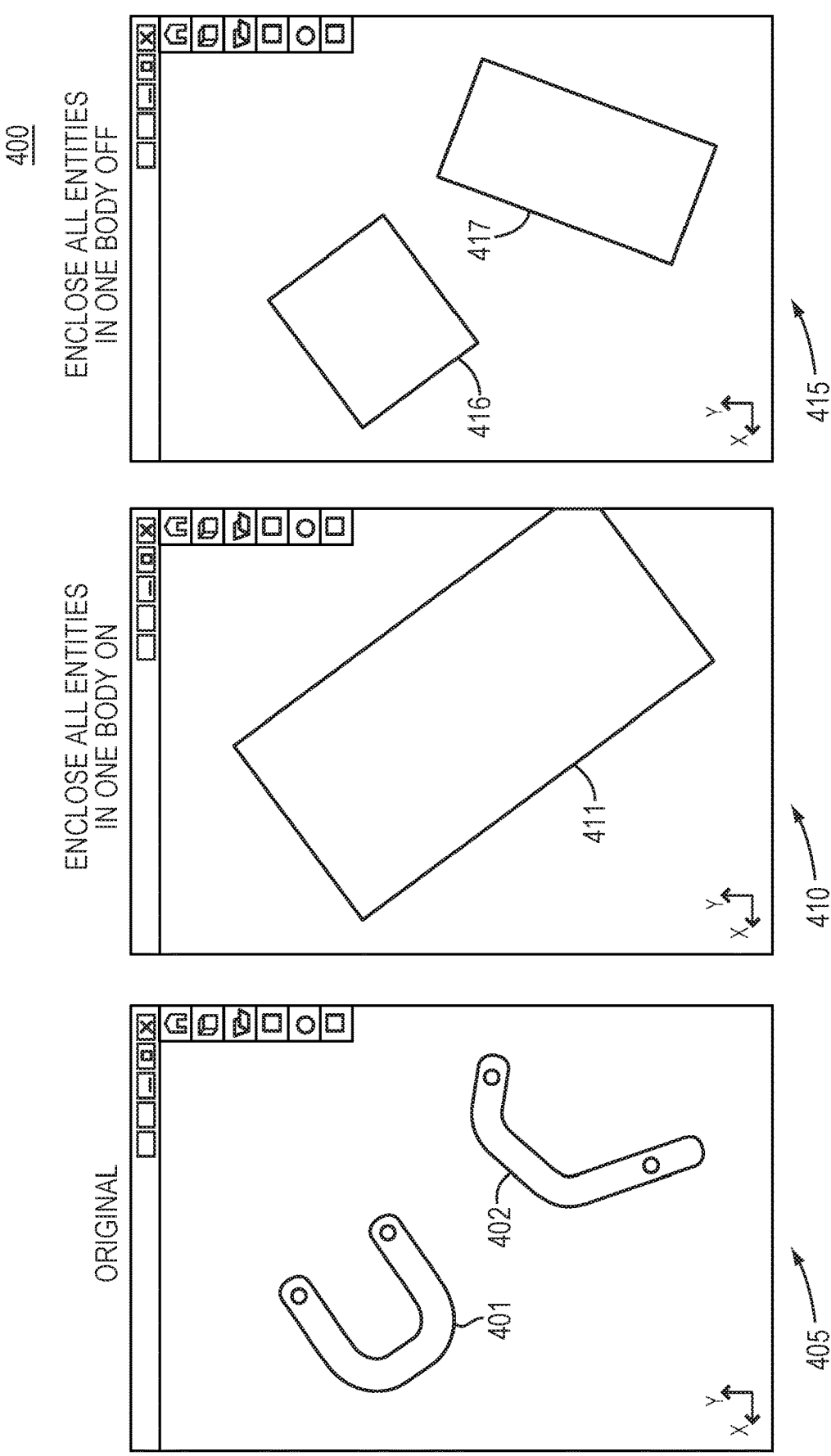
FIG. 4A-4D are schematic views of different implementations of a simplification operation in example embodiments of the present invention.

The user may also configure the CAD system to enclose each of the selected one or more components into separate simplified geometric entities. For example, the user may uncheck the "Enclose in one body" checkbox 234 of FIG. 2. If the user configures the CAD system in this manner, the CAD system applies the simplification operation of step 165 (described above) individually to each of the selected one or more components according to the respective selected simplification type. As a result, the simplification operation derives a separate simplified geometric entity for each of the selected one or more components, as shown in FIGS. 4A (415), 4C (475), and 4D (490). In the case of the tight fit simplification type, the simplification operation may only derive separate simplified geometric entities for the selected one or more components, as shown at 485, 490 in FIG. 4D.

Returning to the flow diagram of FIG. 1A, the method 100, at step 170, generates a simplified CAD from the derived simplified geometric entity or entities from step 165. In some embodiments, step 170 may store the simplified generated CAD model in a new file (e.g., a part file) or other formatted memory communicatively coupled to the CAD system. The features of the selected one or more components excluded from view by the derived simplified geometric entity are not included in the memory of the stored simplified CAD model. The derived geometric entity in the stored simplified CAD model of step 170 may be associated (mapped) in memory to the selected one or more components of the original received CAD model of step 155. Such associativity enables the CAD system to update the simplified CAD model to reflect design changes made by a user in the original received CAD model. In some embodiments, such associativity also enables the CAD system to update the original received CAD model to reflect changes to the simplified CAD model.

The method 100 may repeat steps 160-170 to derive further simplified geometric entities for other groups of one or more components in the received CAD model. The method 100, step 170, replaces each group in the simplified CAD model with the respective derived simplified geometric entity or entities. The method 100 (step 165) may also merge overlapping derived simplified geometric entities of two or more groups into a single simplified geometric entity.

The method 100 (step 170) then generates a simplified CAD model with the resulting (from the merge) single simplified geometric entity. In embodiments, the user may merge groups of components by checking the "Merge groups after this step" checkbox 210 of FIG. 2

Figure 1B:
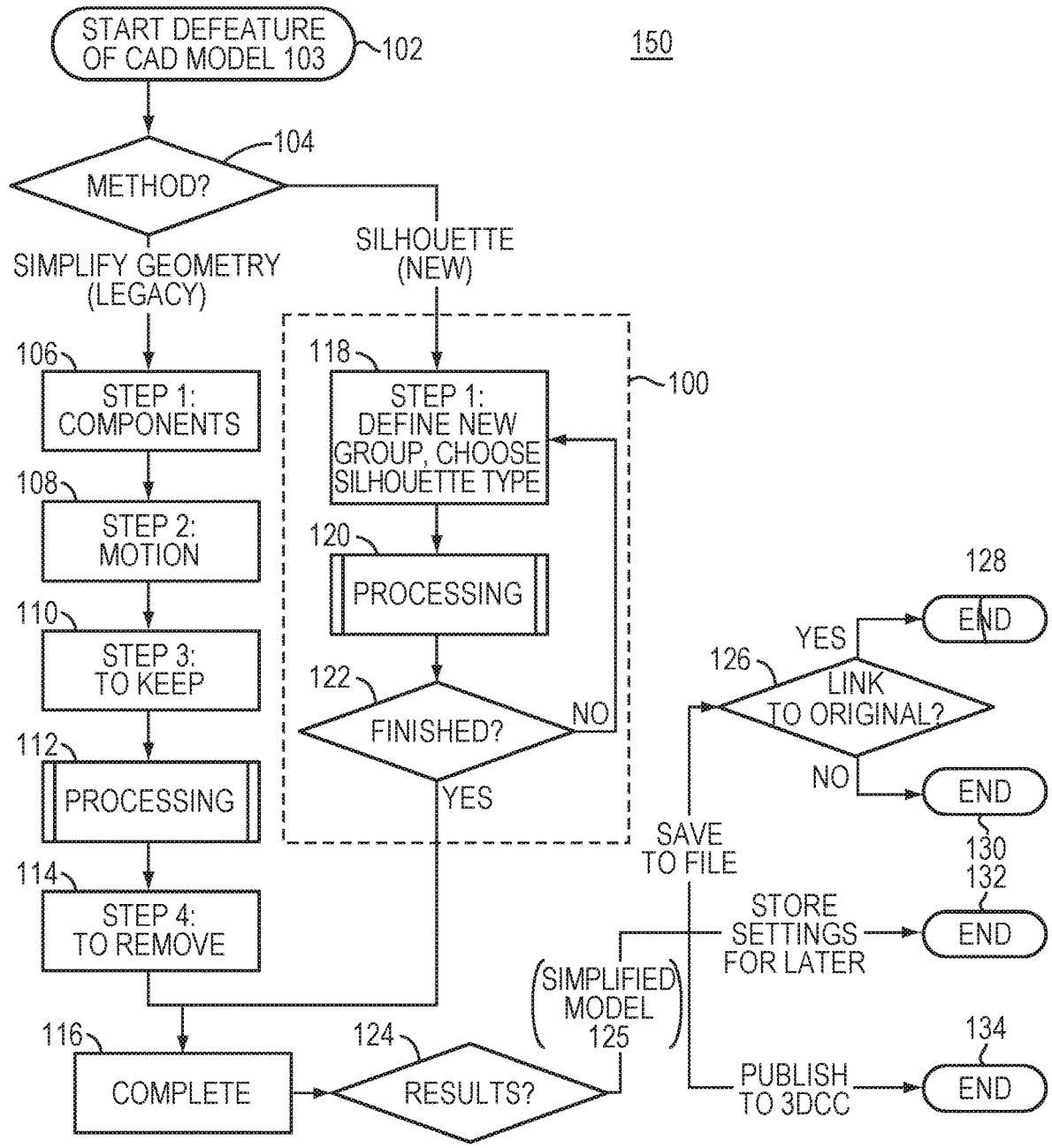
FIG. 1B is a flow diagram of CAD modeling in a CAD system that includes both a legacy defeature operation and the improved defeature operation of example embodiments of the present invention.

FIG. 1B is a flow diagram of a CAD model function referred to as "defeaturing" or defeature method 150 in a CAD system. In the illustrated embodiments, the defeature method 150 applies either the legacy defeature operation of the fourth prior art approach describe above or the improved defeature operation 100 of the present invention detailed in FIG. 1A. In FIG. 1B, the improved defeature operation 100 may be implemented as an extension of the commands used in the legacy defeature method.

The method 150 begins at step 102 by a user selecting to defeature a specified 3D model 103 of a CAD system. The user may select to defeature the model through a graphical user interface of the CAD system or any other manner known in the art. As part of selecting to defeature the model, the user may select whether to use the legacy defeature operation (method) or the improved defeature operation (method 100) of the present invention. The method 150, at step 104, determines which defeature operation the user selected to use to simplify the specified 3D model 103. If step 104 determines that the user selected the legacy operation, step 104 proceeds to simplify (defeature) the geometry of the specified CAD model in accordance with the fourth prior art approach described above.

Using the legacy defeature operation, the method 150, at step 106, assumes that all the components (geometry) of the specified CAD model 103 are to be simplified. The method 150, at step 108, performs a motion analysis on all the components to locate mate relationships to be maintained in the simplified geometry. The method 150, at step 110, also enables the user to select features to maintain in the simplified geometry. Based on the results of steps 106-110, the method 150, at step 112, performs processing to calculate the simplified geometry for the specified CAD model 103. In performing the calculation, step 112 analyzes all the components in the specified CAD model 103, and simplifies the geometry by removing small features such as holes, fillets, and embossed text. Step 112 also fills-in any enclosed voids in the simplified geometry to consume any internal features. If the CAD model is complex (e.g., with thousands of components and features), the calculation of the simplified geometry at step 112 is computationally intensive and not practical due to the excessive compute time and memory requirements. After the calculation, the method 150, step 114, enables the user to view and select features still remaining in the simplified geometry for removal from the simplified geometry. The method, at step 116, then completes the defeaturing of the CAD model 103. If results (the simplified geometry) are generated from the defeaturing, the method 110, at step 124, outputs the results as a simplified model 125.

If step 104 instead determines that the user selected to use the improved (new) defeature operation (e.g., method 100), step 104 proceeds to simplify the CAD model 103 according to embodiments of the present invention. In these embodiments, the method 150, at step 118, enables the user to define a group of components of the specified CAD model to simplify (defeature) and a silhouette type (simplification type) used to perform a simplification operation on the defined group as detailed above in FIG. 1A. The silhouette type may be rectangle, circle, polygon outline, tight fit outline, and such. The method 150, at step 120, performs processing to calculate (derive) a simplified geometric entity (or entities) for the defined group of components based on the defined silhouette type. In embodiments, the method 100 of FIG. 1B may use the method 150 of FIG. 1A to derive the simplified geometric entity. The method 150, at step 122, checks whether the user would like to define another group of components of the specified CAD model 103 to simplify. If the user would like to define another group, the method 150 repeats steps 118-122 on CAD model 103. Otherwise, the method, proceeds to at step 116, completes the simplifying/defeaturing of the CAD model 103.

If results (the simplified geometric entity) are generated from the improved defeaturing, the method 150, at step 124, outputs the results as a simplified model 125. Step 124 generates the simplified CAD model from the simplified geometric entity derived by step 120. The method 150 may replace components in a CAD model (the specified CAD model or another CAD model) with the generated simplified CAD model. The method 150 may use a separate command (from the defeature command) to replace the components in the CAD model.

For both defeature operations (legacy and improved of present invention), the method 150, at step 124, provides the user an option to save the respective defeaturing results (output simplified model 125) as a part file. In the defeature operations, the method 150, at step 126, provide the user an option to link the part file of the simplified model 125 to the part file of the original model (specified CAD model 103). If the user selects to link the part files, the method 150, at step 126, performs the linking and ends at step 128. Otherwise, the method 150 ends at step 130. The method 150, at step 124, also provides the user an option to store the defeaturing results as settings to be applied later in the CAD system by the user. If the user selects to store the results as settings, the method 150 performs the storing and ends at step 132. The method 150, at step 124, also provides the user an option to publish the results to an online catalog, such as 3D ContentCentral (3DCC). If the user selects to publish the results, the method 150 performs the publishing and ends at step 134.

Example User Interfaces for Simplifying (Defeaturing) CAD Model

Figure 2:
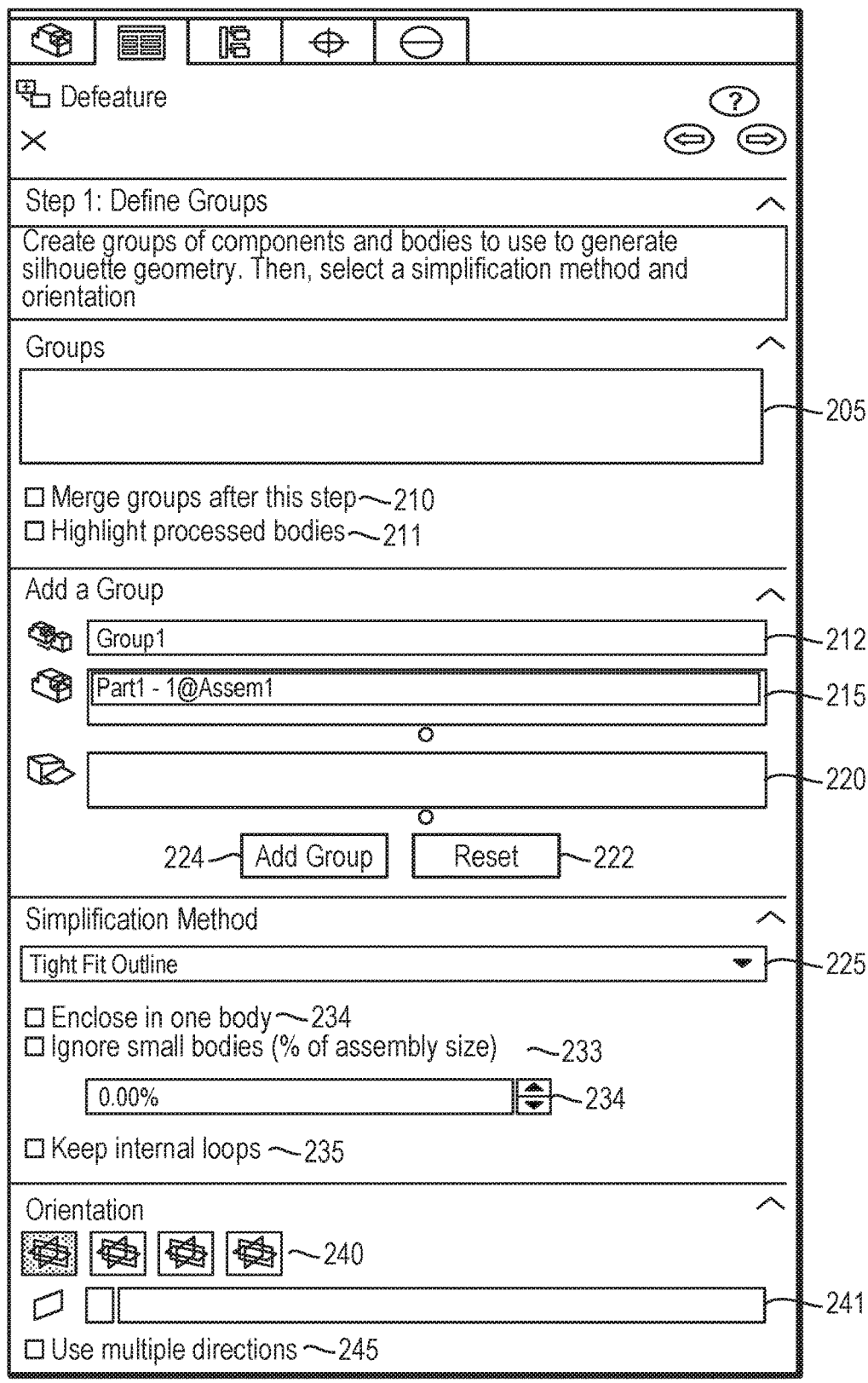
FIG. 2 is a schematic view of a graphical user interface for configuring a defeaturing operation in example embodiments of the present invention.

FIG. 2 shows an example user interface (GUI) 200 of a CAD system for implementing a simplified (defeatured) model 125 in embodiments of the present invention. Through the user interface 200 of FIG. 2, the user configures one or more groups of components of a specified 3D model 103 to be simplified in the graphical viewing area of the CAD system. To configure a group, the user enters any name for the group (e.g., Group1) in textbox 212. The user may then use the dropdown menu 215 to select one or more parts of the specified 3D model 103 to include in the named group. The user may also use the dropdown menu 220 to select one or more bodies (e.g., solid bodies, surface bodies, etc.) of the specified 3D model to include in the named group. The user may then select the "Add Group" button 224 to create the named group, which is displayed in text window 205. The user may instead select the "Reset" button 222 to clear the textbox 212, dropdown menu 215 selection(s) by the user, and dropdown menu 220 selection(s) by the user.

The user may select a group displayed in the textbox 205 and select a simplification method (operation) to apply to the group from dropdown menu 225. The simplification methods listed in the dropdown menu 225 include box, cylinder, polygon outline, and tight fit outline. The CAD system respectively derives one or more simplified geometric entities of the selected group by projecting a silhouette outline (according to the selected simplification method) to enclose the parts/bodies of the selected group. The enclosing of the parts/bodies by the projected silhouette outline excludes features of the parts/bodies. The user may select checkbox 230 to configure the CAD system to derive one simplified geometric entity to enclose all configured components/bodies of the selected group (as shown by 410 of FIG. 4A, 430 of FIG. 4B, and 470 of FIG. 4C). Otherwise, the CAD system may automatically derive multiple simplified geometric entities to enclose the configured parts/bodies of the selected group (as shown in 415 of FIG. 4A, 475 of FIG. 4C, and 490 of FIG. 4D).

Configuring with FIG. 2, the user may select checkbox 233 to configure the CAD system to ignore small bodies of a selected group when deriving the one or more simplified geometry entities. The user further specifies a percentage of the model assembly size in selection menu 234, such that bodies less than that specified percentage are ignored by the CAD system when deriving the one or more simplified geometry entities. When using the polygon outline and tight fit outline simplification operation, the user may also select checkbox 235 to configure the CAD system to keep internal loops (internal holes and cuts on the selected one or more components) in the one or more derived simplified geometry entities. The user may specify an orientation for the derived one or more simplified geometry entities using icons 240. If the selected simplification option is tight fit online, the user may select checkbox 245 to enable configuration of multiple orientations using icons 240 (otherwise the user may only select one orientation). The orientations shown by the icons 240 include automatic, front plane, side plane, top plane, or any custom plane configurable using selection box 241.

The user may further select checkbox 210 to configure the CAD system to merge derived simplified geometric entities of multiple groups that overlap after the CAD system completes simplification of the groups. The user may also select checkbox 211 to configure the CAD system to highlight the parts/bodies of each group in the graphical viewing area after the CAD system completes simplification of the group.

The simplified geometry entities derived from the configuration are displayed in another preview window. The CAD system may also save the results (derived simplified geometric entities) to a part model file (which may represent a simplified model 125). The resulting part file can be linked to input assembly documents (of the simplified model 125) so that the part file can be updated by the CAD system when the source document (of the original model 103) changes.

Figure 3:
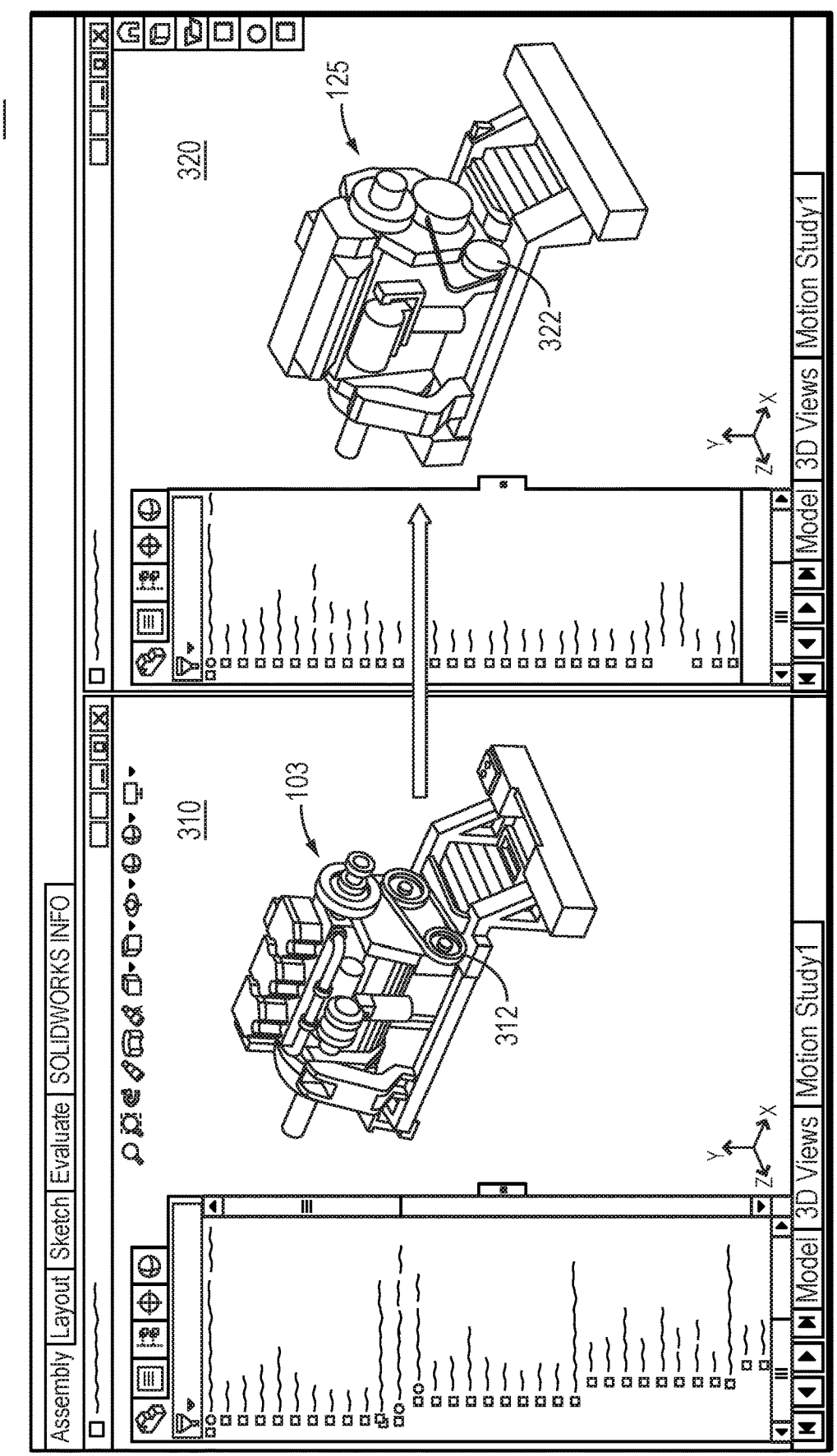
FIG. 3 is a schematic view of graphical user interfaces illustrating the results of a defeaturing operation in an example embodiment of the present invention.

FIG. 3 shows an example user interface 300 of a CAD system for implementing a simplified (defeatured) model in embodiments of the present invention. The left-side window (graphical view or pane) 310 shows an original 3D CAD model 103 representing the real-world object as an assembly. The CAD model 103 is formed of plural components having features, including the highlighted component 312. In example embodiments, the component 312 is highlighted based on a user selecting checkbox 211 of FIG. 2. The right-side window (graphical view or pane) 320 shows the simplified model 125 (B-rep geometry) formed of simplified geometric entities that are derived from the plural components. The features of the plural components are excluded from view in the simplified geometric entities shown in the simplified model 125 (graphical view 320). For example, the simplified geometric entity 322 derived for the highlighted component 312 does not show the features of highlighted component 312. The CAD system may save the simplified model 125 shown in pane 320 as a part model in system memory.

Types of Defeaturing Operations

FIG. 4A illustrates the implementation 400 of a bounding box simplification operation used in embodiments of the present invention. The bounding box operation provides the simplest geometric representation for selected components of a CAD model. In the example of FIG. 4A, an original CAD model includes two components 401, 402 shown in graphical view 405. A user selects these two components 401, 402 to be simplified and defeatured. The user further selects the simplification type of rectangle to be used for the simplification operation, such as by using menu 225 of the user interface 200 of FIG. 2. In the example at 410 of FIG. 4A, the user turns on the option to enclose all the selected components in one simplified geometric entity (bounding box), such as by selecting checkbox 230 of GUI 200 of FIG. 2. Based on the simplification type selected as rectangle, the CAD system then applies the bounding box simplification operation (e.g., as previously describe in reference to step 165 of method 100) to tightly enclose the selected two components 401, 402 together in one bounding box 411. By enclosing the two components 401, 402 in the bounding box 411, the features (e.g., holes) on each of the two components 401, 402 are excluded from graphical view 410. When storing the simplified geometric entity (bounding box) 411 in memory as part of a simplified model, the simplified geometric entity 411 is stored without the excluded features.

In the example at 415 of FIG. 4A, the user turns off the option to enclose all the entities in one simplified geometric entity, such as by unselecting checkbox 230 of FIG. 2. The CAD system then applies the bounding box simplification operation (e.g., as previously describe in reference to step 165 of method 100) to each of the two components 401, 402 individually, such that each component is tightly enclosed in a separate respective bounding box. That is, component 401 is tightly enclosed in bounding box 416, and component 402 is tightly enclosed in bounding box 417. By enclosing each component 410, 402 in respective bounding boxes 416, 417, the features (e.g., holes) on the components are excluded from graphical view 415. When storing each simplified geometric entity (bounding box) 416, 417 in memory as part of a simplified model, the simplified geometric entity 416, 417 is stored without the excluded features.

Figure 4B:
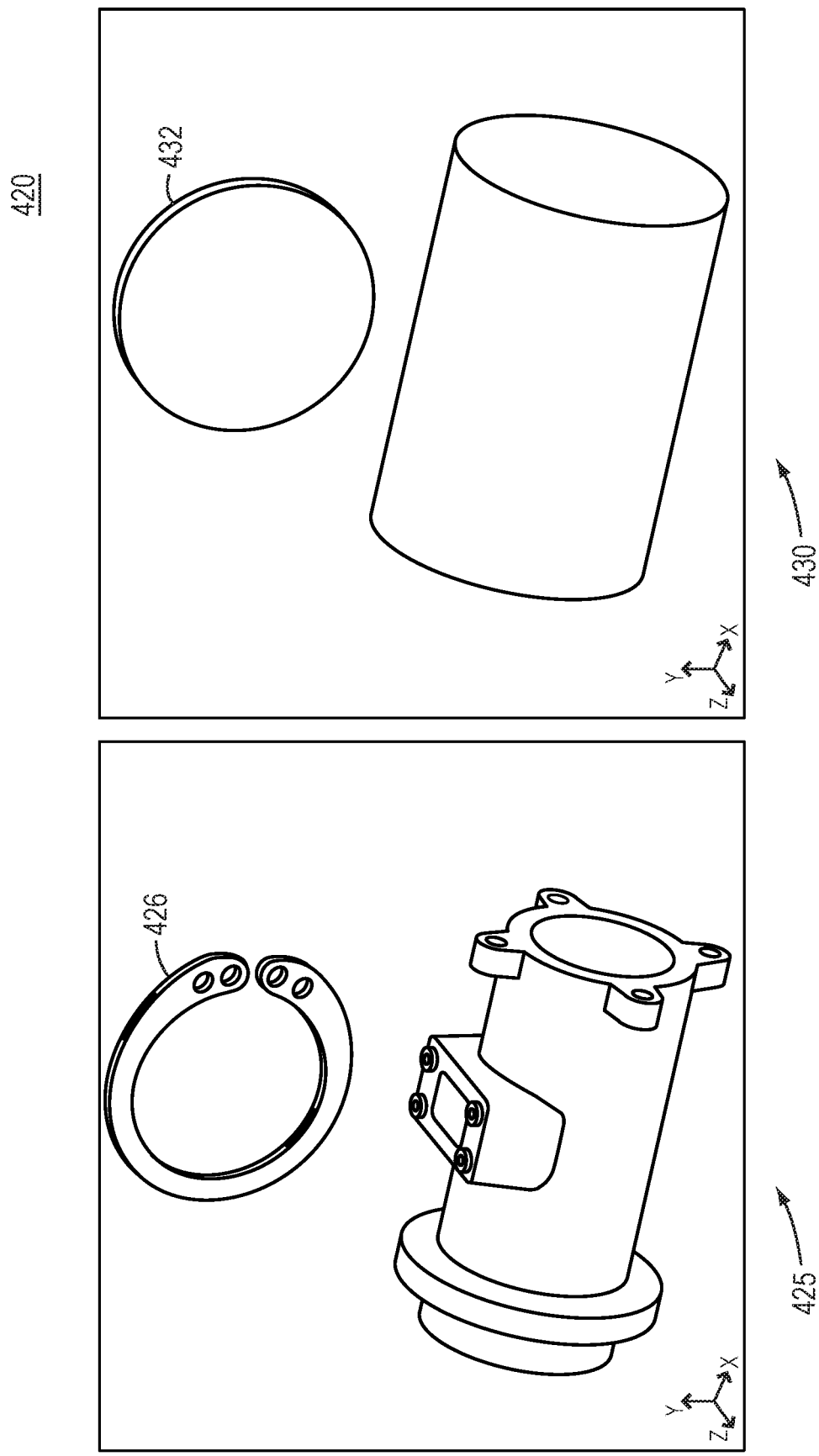

FIG. 4B illustrates the implementation 420 of a bounding cylinder simplification operation used in embodiments of the present invention. In the example of FIG. 4B, an original CAD model includes the component 426 shown in graphical view 425. A user selects the component 426 to be simplified and defeatured. The user further selects the simplification type of circle to be used for the simplification operation, such as by using menu 225 of GUI 200 in FIG. 2. Based on the simplification type selected as circle, the CAD system then applies the bounding cylinder simplification operation (e.g., as describe above in reference to step 165 of method 100) to tightly enclose the selected component 426 in a bounding cylinder 432, as shown in FIG. 4B at 430. By enclosing the component 426 in the bounding cylinder 432, the hole features and extruding features on the component 426 are excluded from graphical view 430. When storing the simplified geometric entity (bounding cylinder) 432 in memory as part of a simplified model, the simplified geometric entity 432 is stored without the excluded features.

Figure 4C:
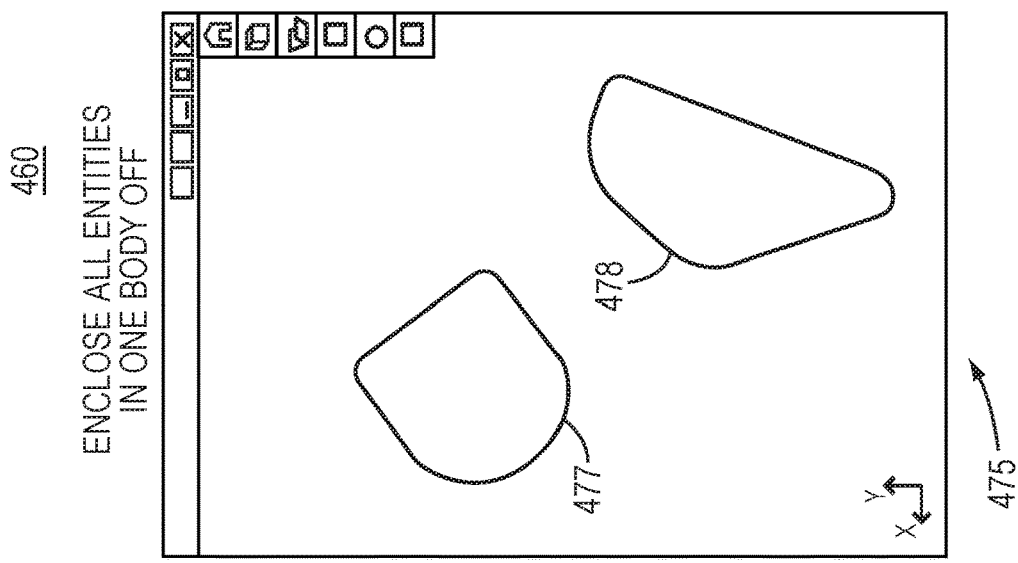
Figure 4C:
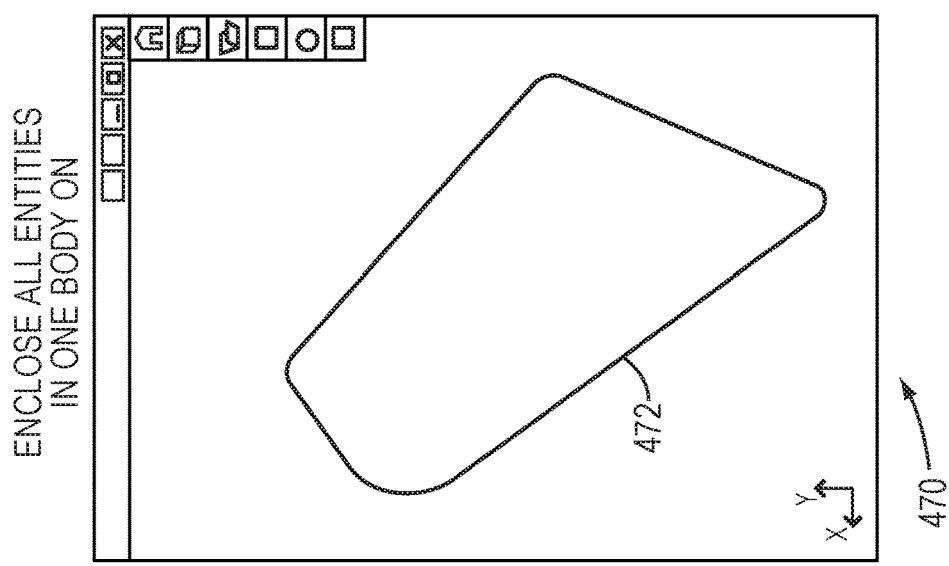
Figure 4C:
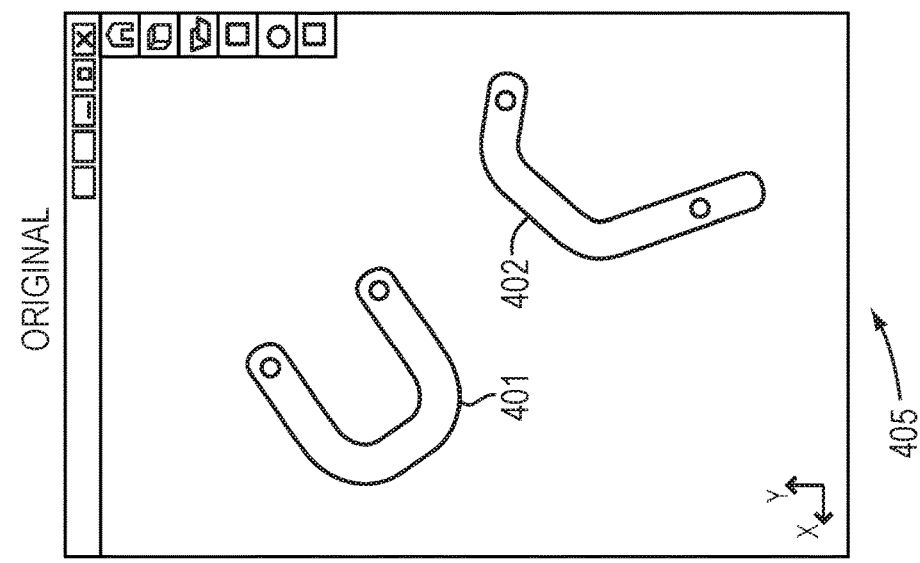

FIG. 4C illustrates the implementation 460 of a polygon outline simplification operation used in embodiments of the present invention. In the example of FIG. 4C, an original CAD model includes the two components 401, 402 shown in graphical view 405. A user selects these two components 401, 402 to be simplified and defeatured. The user further selects the simplification type of polygon outline to be used for the simplification operation, such as by using menu 225 of the FIG. 2 user interface 200. In the example at 470 of FIG. 4C, the user turns on the option to enclose all the selected components 401, 402 in one simplified geometric entity (polygon outline) 472, such as by selecting checkbox 230 of the user interface (GUI) 200 of FIG. 2. Based on the simplification type selected as polygon outline, the CAD system then applies the polygon outline simplification operation (e.g., as describe previously in reference to step 165 of method 100) to form a solid tight fit 3D polygonal body 472 around the selected two components 401, 402. By enclosing the two components 401, 402 in the polygon body, the features (e.g., holes) on each of the two components 401, 402 are excluded from graphical view 470. When storing the simplified geometric entity (polygon body) 472 in memory as part of a simplified model, the simplified geometric entity 472 is stored without the excluded features.

In the example at 475 of FIG. 4C, the user turns off the option to enclose all the entities in one simplified geometric entity, such as by unselecting checkbox 230 of GUI 200 of FIG. 2. The CAD system then applies the polygon outline simplification operation (e.g., as described above in reference to step 165 of method 100) to each of the two components 401, 402 individually, such that a separate respective solid tight fit 3D polygonal body 477, 478 is formed around each component 401, 402. That is, a solid tight fit polygonal body 477 is formed around component 401, and a solid tight fit polygonal body 478 is formed around component 402. By forming a respective solid tight fit polygon body 477, 478 around each component 401, 402, the features (e.g., holes) on the components 401, 402 are excluded from graphical view 475. Thus, when storing the simplified geometric entity (solid tight fit polygon body) 477, 478 in memory as part of the simplified model, the simplified geometric entity 477, 478 is stored without the excluded features. In some embodiments, the user may select not to exclude internal holes and cuts from the formed solid tight fit polygonal 477, 478, such as by selecting "Keep internal loops" checkbox 235 of GUI 200 of FIG. 2. In turn, when storing the simplified geometric entity (solid tight fit polygon body) 477, 478 in memory as part of a simplified model, the simplified geometric entity 477, 478 is stored including features.

Figure 4D:
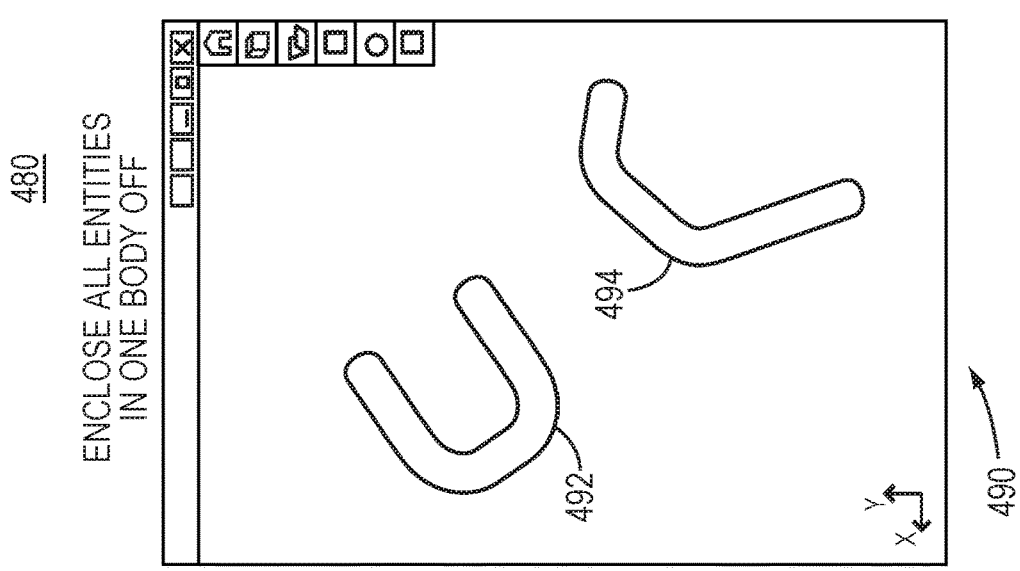
Figure 4D:
Figure 4D:
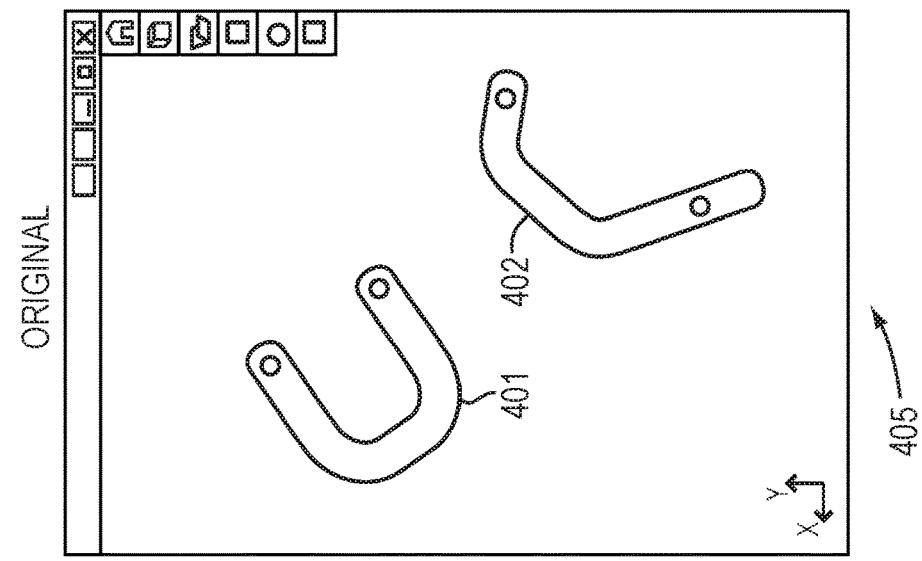

FIG. 4D illustrates the implementation 480 of a tight fit outline simplification operation used in embodiments of the present invention. In the example of FIG. 4D, an original CAD model includes the two components 401, 402 shown in graphical view 405. A user selects these two components 401, 402 to be simplified and defeatured. The user further selects the simplification type of tight fit outline to be used for the simplification operation, such as by using menu 225 of FIG. 2. In the example of FIG. 4D, the option to enclose all the entities in one simplified geometric entity is unavailable 485 due to the selection of the simplification type of tight fit outline. Thus, the CAD system applies the tight fit outline simplification operation (e.g., as previously describe in reference to step 165 of method 100) to each of the two components 401, 402 individually, such that a separate respective solid tight fit 3D body 492, 494 is formed around each component 401, 402. That is, solid tight fit 3D body 492 is formed around component 401, and solid tight fit body 494 is formed around component 402. By forming a respective tight fit body 492, 494 around each component 401, 402, the features (e.g., holes) on the components 401, 402 are excluded from graphical view 490. In some embodiments, the user may select not to exclude internal holes and cuts from the formed solid tight fit bodies 492, 494, such as by selecting "Keep internal loops" checkbox 235 of FIG. 2. In that case, when storing the simplified geometric entity (tight fit body) 492, 494 in memory as part of a simplified model, the simplified geometric entity is stored with features. Otherwise, embodiments store in memory the simplified geometric entity without excluded features in the simplified model when the user has selected the "Keep internal loops" check 235 of the user interface 200 (FIG. 2).

Digital Environment

Figure 5:
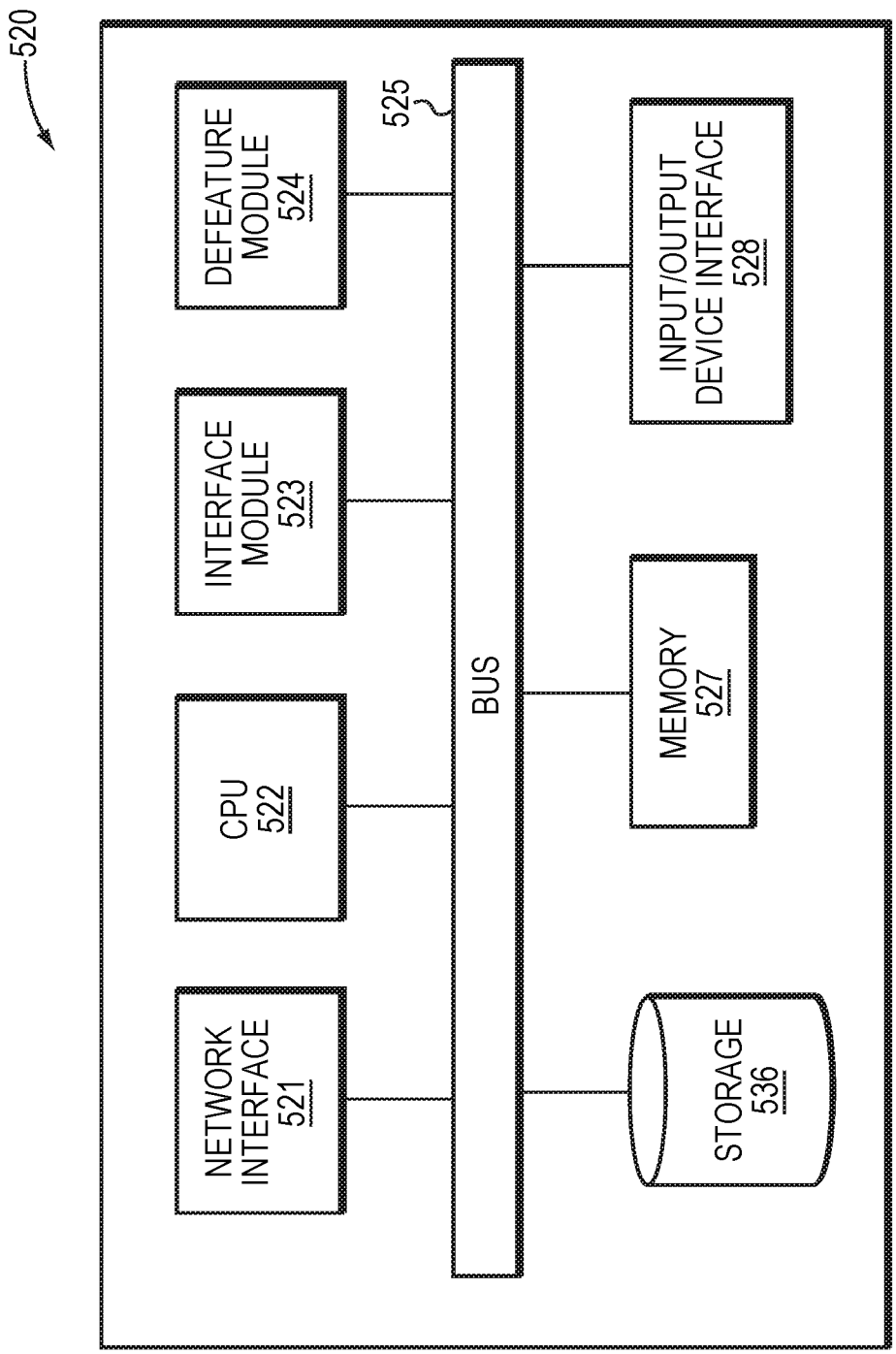
FIG. 5 is a block diagram of a computer (or digital processing) system for defeaturing a 3D model according to at least one embodiment of the present invention.

FIG. 5 is a block diagram of a computer-based system 520, such as a CAD system that employs the above described methods and applications for simplifying a CAD model according to embodiments of the present invention. The computer-based system 520 comprises a bus 525. The bus 525 serves as an interconnector between the various digital processing components of the system 520. Connected to the bus 525 is an input/output device interface 528 for connecting various input and output devices such as a keyboard, mouse, display (e.g., displaying user interface 200 of FIG. 2, user interface 300 of FIG. 3, user interfaces 400, 420, 460, 480 of FIGS. 4A-4D), speakers, etc. to the system 520. A central processing unit (CPU) 522 is connected to the bus 525 and provides for the execution of computer instructions. Memory 527 provides volatile storage for data used for carrying out computer instructions. Storage 536 provides non-volatile storage for software instructions, such as an operating system (not shown). In particular, memory 527 and/or storage 536 are configured with program instructions implementing methods and/or modules 100, 150, 400, 420, 460, and 480 for defeaturing components of a CAD model, as detailed in FIGS. 1A, 1B (118-122), and FIGS. 4A-4D. The system 520 also comprises a network interface 521 for connecting to any variety of networks known in the art, including cloud, wide area networks (WANs) and local area networks (LANs).

Further connected to the bus 525 is an interface module 523. The interface module 523 is configured to enable the user to interactively specify defeaturing parameter (variable) values for simplifying a CAD model (e.g., using the user interface 200 shown in FIG. 2). The interface module 523 may provide input and output functions to the user through any means known in the art. For example, the interface module 523 may display defeaturing parameters that are stored on the storage device 536 or memory 527 for enabling the user to input, specify, or otherwise define defeaturing values. For further example, the interface module 523 may enable the user to specify input data (e.g., defeaturing configuration values) that is transmitted to any point communicatively coupled to the system 520 via the network interface 521 and/or input/output device interface 528.

The system 520 further comprises a defeature module 524 that is communicatively/operatively coupled to the interface module 523. The defeature module 524 is configured to derive simplified (defeatured) geometric entities based on the specified defeature configuration values for a CAD model. To do so, the defeature module 524 may project a silhouette outline that encloses one or more components of the CAD model to derive the simplified geometric entities. The defeature module 524 may enclose the one or more components according to the simplification method of tight fit outline, polygon outline, circle, rectangle, etc. The defeature module 524 may store the simplified geometric entities on the storage device 536 or memory 527. For another example, the defeature module 524 may formulate the simplified geometric entities by means of the CPU 522 via the bus 525. For further example, the defeature module 524 may retrieve simplified geometric entities from any point communicatively coupled to the system 520 via the network interface 521 and/or input/output device interface 528.

It should be understood that the example embodiments described herein may be implemented in many different ways. In some instances, the various methods and machines described herein may each be implemented by a physical, virtual, or hybrid general purpose computer, such as the computer system 520. The computer system 520 may be transformed into the machines that execute the methods described herein, for example, by loading software instructions into either memory 527 or non-volatile storage 536 for execution by the CPU 522. Further, while the interface module 523 and optimizer module 524 are shown as separate modules, in an example embodiment these modules may be implemented using a variety of configurations.

The system 520 and its various components may be configured to carry out any embodiments of the present invention described herein. For example, the system 520 may be configured to carry out the methods and/or modules 100, 150, 200, 300, 400, 420, 460, and 480 described hereinabove in relation to FIGS. 1A-1B, 2, 3, 4A-4D. In an example embodiment, the interface module 423 and defeature module 424 may be implemented in software that is stored on the memory 527 and/or storage device 536. In such an example embodiment, the CPU 522 and the memory 527 with computer code instructions stored on the memory 527 and/or storage device 536 implement an interface module 523 that allows a user to simplify and defeature a 3D CAD model.

Figure 6:
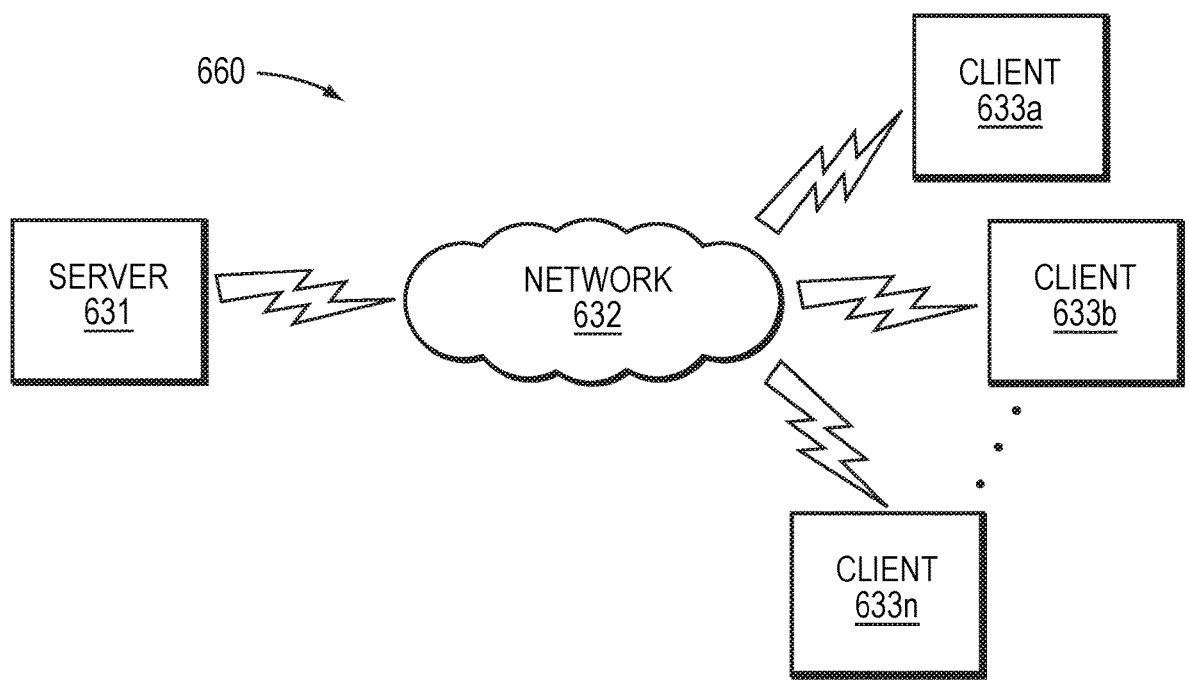
FIG. 6 is a schematic diagram of an example computer network environment in which embodiments of the present invention may be implemented.

FIG. 6 illustrates a computer network environment 660 in which an embodiment of the present invention may be implemented. In the computer network environment 660, the server 631 is linked through the communications network 632 to the clients 633a-n. The environment 660 may be used to allow the clients 633a-n, alone or in combination with server 631, to execute any of the modules and/or methods described hereinabove (e.g., methods/UIs 100, 150, 200, 300, 400, 420, 460, and 480, described hereinabove in relation to FIGS. 1A-1B, 2, 3, and 4A-4D). It should be understood that the example embodiments described above may be implemented in many different ways. In some instances, the various methods, interfaces, and machines described herein may be implemented by one or more physical, virtual, or hybrid general purpose computer, parallel processors, distributed processors, a cloud-based platform, or a computer network environment such as the computer environment 660.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and, thus, the data processors described herein are intended for purposes of illustration only and not as a limitation of the embodiments.

While example embodiments have been particularly shown and described, it will be understood by those skilled in the art that various changes in form and details may be made therein without departing from the scope of the embodiments encompassed by the appended claims.

What is claimed is:

1. A computer-implemented method of providing a graphical user interface (GUI) with improved performance by generating a simplified computer-aided design (CAD) model, the method comprising:
    receiving a CAD model of a real-world object, the received CAD model representing the real-world object as an assembly, the CAD model being formed of the assembly, plural components, and features;
    in response to user command, selecting one or more components of the plural components of the received CAD model, the selected one or more components being situated in spatial proximity in the received CAD model;
    applying a simplification operation to the selected one or more components, the simplification operation deriving a simplified geometric entity, approximating geometry of the selected one or more components, by projecting and extruding at least one silhouette outline that encloses the selected one or more components, the at least one projected and extruded silhouette outline excluding features of the selected one or more components;
    generating a simplified CAD model from the derived simplified geometric entity, wherein the generated simplified CAD model represents the selected one or more components; and
    rendering the simplified CAD model in a GUI, thereby providing a GUI with improved performance.

2. The method of claim 1, wherein the selected one or more components include at least one of: a part, a subassembly, a solid body, and a surface body of the real-world object as represented in the CAD model.

3. The method of claim 1, further comprising:
    if the selected one or more components are unable to be enclosed by a single projected and extruded silhouette outline, projecting and extruding multiple silhouette outlines to enclose the selected one or more components; and
    combining the multiple projected and extruded silhouette outlines by using a Boolean operation to locate common volume of the selected one or more components.

4. The method of claim 1, wherein the simplified geometric entity of the generated simplified CAD model is associated in memory to the selected one or more components of the received CAD model, the association enabling updating the generated simplified CAD model when a user changes the received CAD model.

5. The method of claim 1, wherein applying the simplification operation includes one or more of:
    selecting a type for each projected and extruded silhouette outline, the selected type being one or more of: a rectangle, a circle, a polygon outline, and a tight fit outline;
    selecting an orientation of the derived simplified geometric entity, the selected orientation being one or more of: automatic, front plane, side plane, top plane, and custom plane;
    indicating certain features of the selected one or more components that are to be maintained in the derived simplified geometric entity;
    indicating small components that are less than a certain percentage of the CAD model assembly and are to be ignored when projecting and extruding the at least one silhouette outline; and
    indicating whether to derive one simplified geometric entity or multiple simplified geometric entities from the selected one or more components.

6. The method of claim 5, wherein if the selected type is a rectangle, generating the at least one projected and extruded silhouette outline by:
    automatically computing a smallest volume bounding box capable of tightly enclosing the selected one or more components.

7. The method of claim 5, wherein if the selected type is circle, generating the at least one projected and extruded silhouette outline by:
    automatically computing a smallest volume bounding cylinder capable of tightly enclosing the selected one or more components, wherein computing a cylinder radius, an axis, and a center point of the bounding cylinder using a largest cylindrical face of the selected one or more components.

8. The method of claim 5, wherein if the selection type is a polygon outline, generating the at least one projected and extruded silhouette outline by:
    automatically computing a 3D polygon body that tightly encloses the selected one or more components, the computing:
        (i) creates an initial outline of the selected one or more components from an automatically determined projection direction,
        (ii) projects the initial outline on a plane and computes a convex hull polygon around the initial outline to create a planar polygon, and
        (iii) extrudes the created planar polygon in the automatically determined projection direction to form the projected and extruded silhouette outline to fit around the selected one or more components.

9. The method of claim 5, wherein if the selection type is a tight fit outline, generating the at least one projected and extruded silhouette outline by:
    automatically computing a 3D body that tightly encloses the selected one or more components, the computing:
        (i) creates an initial outline of the selected one or more components from an automatically determined projection direction, and
        (ii) extrudes the initial outline in the automatically determined projection direction to form the projected and extruded silhouette outline to fit around the selected one or more components.

10. The method of claim 5, wherein the simplification operation automatically determines a projection direction for the at least one projected and extruded silhouette outline by using a largest planar face of the selected one or more components.

11. The method of claim 1, further comprising:
configuring multiple groups of components, each group formed by selecting one or more components of the received CAD model corresponding to the group;
applying the simplification operation to each of the multiple groups and deriving respective simplified geometric entities;
creating one simplified geometric entity by merging the respective derived simplified geometric entities; and
generating the simplified CAD model from the one simplified geometric entity.

12. The method of claim 1, wherein the at least one projected and extruded silhouette outline excludes the features of the selected one or more components from view of the user and from memory storing the simplified CAD model.

13. The method of claim 1, wherein the derived simplified geometric entity is a three-dimensional (3D) boundary representation (B-rep) geometry.

14. A computer system for providing a graphical user interface (GUI) with improved performance by generating a simplified computer-aided design (CAD) model, the system comprising:
a processor; and
a data storage memory operatively coupled to the processor and comprising instructions to configure the processor to:
receive a CAD model of a real-world object, the received CAD model representing the real-world object as an assembly, the CAD model being formed of the assembly, plural components, and features;
in response to user command, select one or more components of the plural components of the received CAD model, the selected one or more components being situated in spatial proximity in the received CAD model;
apply a simplification operation to the selected one or more components, the simplification operation deriving a simplified geometric entity, approximating geometry of the selected one or more components, by projecting and extruding at least one silhouette outline that encloses the selected one or more components, the at least one projected and extruded silhouette outline excluding features of the selected one or more components;
generate a simplified CAD model from the derived simplified geometric entity, wherein the generated simplified CAD model represents the selected one or more components; and
render the simplified CAD model in a GUI, thereby providing a GUI with improved performance.

15. The system of claim 14, wherein the selected one or more components include at least one of: a part, a subassembly, a solid body, and a surface body of the real-world object as represented in the CAD model.

16. The system of claim 14, further comprising instructions to configure the processor to:
if the selected one or more components are unable to be enclosed by a single projected and extruded silhouette outline, project and extrude multiple silhouette outlines to enclose the selected one or more components; and
combine the multiple projected and extruded silhouette outlines by using a Boolean operation to locate common volume of the selected one or more components.

17. The system of claim 14, wherein the simplified geometric entity of the generated simplified CAD model is associated in memory to the selected one or more components of the received CAD model, the association enabling updating the generated simplified CAD model when a user changes the received CAD model.

18. The system of claim 14, wherein applying the simplification operation includes one or more of:
selecting a type for each projected and extruded silhouette outline, the selected type being one or more of: a rectangle, a circle, a polygon outline, and a tight fit outline;
selecting an orientation of the derived simplified geometric entity, the selected orientation being one or more of: automatic, front plane, side plane, top plane, and custom plane;
indicating certain features of the selected one or more components that are to be maintained in the derived simplified geometric entity;
indicating small components that are less than a certain percentage of the CAD model assembly and are to be ignored when projecting and extruding the at least one silhouette outline; and
indicating whether to derive one simplified geometric entity or multiple simplified geometric entities from the selected one or more components.

19. The system of claim 18, wherein if the selected type is a rectangle, further comprising instructions to configure the processor to generate the at least one projected and extruded silhouette outline by:
automatically computing a smallest volume bounding box capable of tightly enclosing the selected one or more components.

20. The system of claim 18, wherein if the selected type is circle, further comprising instructions to configure the processor to generate the at least one projected and extruded silhouette outline by:
automatically computing a smallest volume bounding cylinder capable of tightly enclosing the selected one or more components, wherein computing a cylinder radius, an axis, and a center point of the bounding cylinder using a largest cylindrical face of the selected one or more components.

21. The system of claim 18, wherein if the selection type is a polygon outline, further comprising instructions to configure the processor to generate the at least one projected and extruded silhouette outline by:
automatically computing a 3D polygon body that tightly encloses the selected one or more components, the computing:
(i) creates an initial outline of the selected one or more components from an automatically determined projection direction,
(ii) projects the initial outline on a plane and computes a convex hull polygon around the initial outline to create a planar polygon, and
(iii) extrudes the created planar polygon in the automatically determined projection direction to form the projected and extruded silhouette outline to fit around the selected one or more components.

22. The system of claim 18, wherein if the selection type is a tight fit outline, further comprising instructions to configure the processor to generate the at least one projected and extruded silhouette outline by:
automatically computing a 3D body that tightly encloses the selected one or more components, the computing:

(i) creates an initial outline of the selected one or more components from an automatically determined projection direction, and
(ii) extrudes the initial outline in the automatically determined projection direction to form the projected extruded silhouette outline to fit around the selected one or more components.

23. The system of claim 18, wherein the simplification operation automatically determines a projection direction for the at least one projected and extruded silhouette outline by using a largest planar face of the selected one or more components.

24. The system of claim 14, further comprising instructions to configure the processor to:
configure multiple groups of components, each group formed by selecting one or more components of the received CAD model corresponding to the group;
apply the simplification operation to each of the multiple groups and derive respective simplified geometric entities;
create one simplified geometric entity by merging the respective derived simplified geometric entities; and
generate the simplified CAD model from the one simplified geometric entity.

25. The system of claim 14, wherein the at least one projected and extruded silhouette outline excludes the features of the selected one or more components from view of the user and from memory storing the simplified CAD model.

26. The method of claim 1, wherein the derived simplified geometric entity is a three-dimensional (3D) boundary representation (B-rep) geometry.

27. A non-transitory computer-readable data storage medium comprising instructions for providing a graphical user interface (GUI) with improved performance by generating a simplified computer-aided design (CAD) model, the instructions causing a computer to:
receive a CAD model of a real-world object, the received CAD model representing the real-world object as an assembly, the CAD model being formed of the assembly, plural components, and features;
in response to user command, select one or more components of the plural components of the received CAD model, the selected one or more components being situated in spatial proximity in the received CAD model;
apply a simplification operation to the selected one or more components, the simplification operation deriving a simplified geometric entity, approximating geometry of the selected one or more components, by projecting and extruding at least one silhouette outline that encloses the selected one or more components, the at least one projected and extruded silhouette outline excluding features of the selected one or more components;
generate a simplified CAD model from the derived simplified geometric entity, wherein the generated simplified CAD model represents the selected one or more components; and
render the simplified CAD model in a GUI, thereby providing a GUI with improved performance.

* * * * *